United States Patent

Hashimoto

(10) Patent No.: US 9,847,657 B2
(45) Date of Patent: Dec. 19, 2017

(54) BATTERY SYSTEM

(71) Applicant: NEC Energy Devices, Ltd., Sagamihara-shi, Kanagawa (JP)

(72) Inventor: Yasushi Hashimoto, Kanagawa (JP)

(73) Assignee: NEC ENERGY DEVICES, LTD., Sagamihara (JP)

( * ) Notice: Subject to any disclaimer, the term of this patent is extended or adjusted under 35 U.S.C. 154(b) by 129 days.

(21) Appl. No.: 14/775,303

(22) PCT Filed: Jan. 22, 2014

(86) PCT No.: PCT/JP2014/051245
§ 371 (c)(1),
(2) Date: Sep. 11, 2015

(87) PCT Pub. No.: WO2014/141747
PCT Pub. Date: Sep. 18, 2014

(65) Prior Publication Data
US 2016/0028257 A1     Jan. 28, 2016

(30) Foreign Application Priority Data

Mar. 14, 2013   (JP) ................................ 2013-051874

(51) Int. Cl.
*H02J 7/00* (2006.01)
*H01M 10/44* (2006.01)
(Continued)

(52) U.S. Cl.
CPC ......... *H02J 7/0021* (2013.01); *H01M 10/441* (2013.01); *H01M 10/482* (2013.01);
(Continued)

(58) Field of Classification Search
CPC ................... H02J 7/0047; H02J 7/0021; H02J 2007/0067; H02J 2007/0037; H02J 2007/004
(Continued)

(56) References Cited

U.S. PATENT DOCUMENTS 6,329,796 B1 * 12/2001 Popescu ................ H02J 1/10
                                                    320/134
7,498,769 B1 *  3/2009 Potanin ................ H02J 7/045
                                                    320/125
(Continued)

FOREIGN PATENT DOCUMENTS

JP     11-283677 A    10/1999
JP    2008-125268 A    5/2008
(Continued)

OTHER PUBLICATIONS

International Search Report dated Apr. 8, 2014 in PCT/JP2014/051245 with English-language translation (4 pgs.).

Primary Examiner — Nghia Doan
(74) Attorney, Agent, or Firm — Foley & Lardner LLP

(57) ABSTRACT

This battery system includes: a plurality of batteries; a first monitoring unit that receives as input the output of the batteries, compares the output with a prescribed threshold value, and supplies a signal indicating the result; and a second monitoring unit that detects the voltage value of the batteries and supplies a signal indicating the detected voltage value. The battery system is provided with: a first operation mode during which the first monitoring unit and the second monitoring unit are halted; a second operation mode during which the first monitoring unit operates and the second monitoring unit is halted; and a third operation mode during which the first monitoring unit and the second monitoring unit operate.

3 Claims, 4 Drawing Sheets

(51) Int. Cl.
*H01M 10/48* (2006.01)
*G01R 31/36* (2006.01)
*G01R 19/165* (2006.01)

(52) U.S. Cl.
CPC .......... *H02J 7/0047* (2013.01); *H02J 7/0068* (2013.01); *G01R 19/16542* (2013.01); *G01R 31/362* (2013.01); *G01R 31/3658* (2013.01)

(58) Field of Classification Search
USPC .......................................... 320/112, 119, 132
See application file for complete search history.

(56) References Cited

U.S. PATENT DOCUMENTS

2007/0222301 A1* 9/2007 Fadell ..................... G06F 1/266
 307/152
2011/0074435 A1* 3/2011 Mizoguchi ............. G01R 35/00
 324/433
2012/0306506 A1* 12/2012 Kiuchi ............... G01R 31/3658
 324/434

FOREIGN PATENT DOCUMENTS

| | | |
|---|---|---|
| JP | 2010-193597 A | 9/2010 |
| JP | 2010-256335 A | 11/2010 |
| JP | 2011-109768 A | 6/2011 |
| JP | 2011-125118 | 6/2011 |

* cited by examiner

BATTERY SYSTEM

TECHNICAL FIELD

The present invention relates to a battery system provided with batteries.

BACKGROUND ART

In recent years, battery systems equipped with secondary batteries such as lithium ion batteries are being used for a variety of purposes. Such battery systems are used for, for example, back-up power supply with the object of dealing with power outage of home electronics, outdoor stationary type power supply system for residences, auxiliary power supply in a factory or plant facility, and back-up power supply in office buildings. In addition, such battery systems are also used for power peak cutting and peak shifting with the object of using nighttime power and avoiding peak daytime power usage.

With the increasingly widespread use of the above-described battery systems has come the necessity not only for high capacity and high voltage, but also for high safety and economy.

To increase the capacity and voltage of a battery system, a multiplicity of secondary batteries are series-parallel connected. Providing both high safety and economy in a battery system of this type requires both the monitoring of the state of the multiplicity of batteries in the system as well as efficiently matching power requirements to be connected to the power supply (reducing the power consumption in the battery system).

Patent Document 1 (Japanese Unexamined Patent Application Publication No. 2011-109768) discloses a technology in a battery pack that is provided with a battery protection circuit that is shut down when the device that is to be charged/discharged is not connected to the battery pack.

In addition, Patent Document 2 (Japanese Unexamined Patent Application Publication No. 2008-125268) discloses a technology in a battery pack that is provided with a protection circuit that protects the battery in which the operating state of the protection circuit is transitioned to a reduced power consumption state when a command indicating a demand for information of the remaining capacity of the battery is not received from an outside apparatus.

According to the technology of Patent Document 1 and Patent Document 2, a reduction of the power consumption and an increase of economy can be achieved by shutting down the protection circuit or transitioning to a reduced power consumption.

LITERATURE OF THE PRIOR ART

Patent Documents

Patent Document 1: Japanese Unexamined Patent Application Publication No. 2011-109768
Patent Document 2: Japanese Unexamined Patent Application Publication No. 2008-125268

SUMMARY OF THE INVENTION

Problem to be Solved by the Invention

Because only one protection circuit is provided in the technology disclosed in Patent Document 1 and Patent Document 2, there is the problem of the concern for loss of safety should this protection circuit break down. One solution that can be considered to solve this problem is the provision of a plurality of protection circuits and placing each of these protection circuits in operation.

A protection circuit normally uses an ADC (Analog to Digital Converter) to detect the voltage value of a battery and then protects the battery according to the voltage value that was detected. When a plurality of such protection circuits is placed in operation, the power consumption by the ADCs belonging to each of the protection circuits results in an increase of power consumption in the system and the consequent loss of economy.

In addition, during normal operation of the battery system, the voltage values of each of the plurality of batteries must be detected and balance must then be established among the voltages of each of the batteries. However, depending on the conditions of use of the battery system, in some cases safety can be ensured by monitoring whether the voltages of the batteries are kept within a prescribed range. In such cases, merely comparing the voltage values of the batteries with a prescribed threshold value is sufficient, and the actual voltage values of the batteries need not be determined. As a result, when ADCs are used to detect the actual voltage values of batteries, more power is consumed than is necessary and economy is lost, as in when establishing balance of the voltages among the batteries.

It is an object of the present invention to provide a battery system that can realize both safety and economy.

Means for Solving the Problem

The battery system of the present invention for achieving the above-described object includes:
a plurality of batteries;
a first monitor unit that receives as input the outputs of the batteries, compares the outputs with a predetermined threshold value, and supplies a signal indicating the result; and
a second monitor that detects the voltage values of the batteries and supplies a signal indicating the detected voltage values;
wherein the battery system is provided with:
a first operating mode in which the first monitor unit and the second monitor unit are halted, a second operating mode in which the first monitor unit operates and the second monitor unit is halted, and a third operating mode in which the first monitor unit and the second monitor unit operate.

Effect of the Invention

According to the present invention, both safety and economy can be realized.

CARRYING OUT THE INVENTION

Exemplary embodiments of the present invention are next described with reference to the accompanying drawings.

Figure 1:
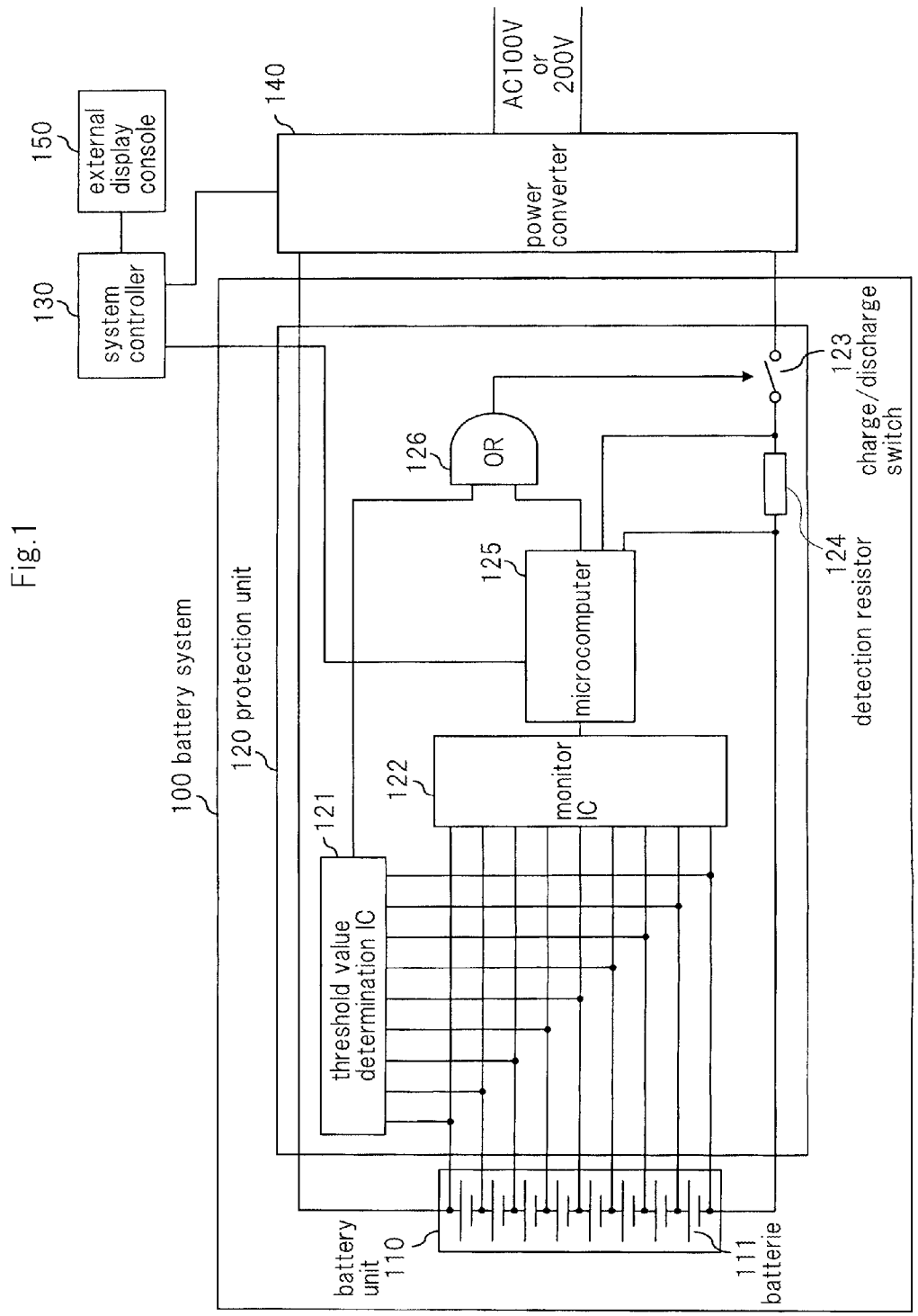
FIG. 1 is a block diagram showing the configuration of the battery system of an exemplary embodiment of the present invention.

FIG. 1 is a block diagram showing the configuration of battery system 100 of an exemplary embodiment of the present invention. The battery system according to the present invention is connected to an object, that is to be connected, and that consists of system controller 130 that controls the overall operation of the system, power converter 140 that carries out AC-DC conversion, and external display console 150 for operation input. In addition, battery system 100 is connected to, for example, a switchboard (not shown) by way of the object that is to be connected to the battery and supplies electric power.

Battery system 100 shown in FIG. 1 includes battery unit 110 and protection unit 120.

Battery unit 110 has a plurality of batteries 111 that are capable of being charged/discharged such as lithium-ion batteries. In the present exemplary embodiment, battery unit 110 is assumed to have a configuration in which a plurality of batteries 111 are connected in series. However, battery unit 110 may also be made up of single battery 111, or may be of a configuration in which a plurality of batteries 111 are connected in parallel or in a matrix.

Protection unit 120 carries out the protective operations to protect batteries 111 of battery unit 110.

Protection unit 120 includes threshold value determination IC (Integrated Circuit) 121, monitor IC 122, charge/discharge switch 123, detection resistor 124, microcomputer 125, and OR circuit 126. Threshold value determination IC 121 is one example of the first monitor unit, and monitor IC 122 is an example of the second monitor unit.

Threshold value determination IC 121 receives the output of each of the plurality of batteries 111 and compares this input with a predetermined threshold value. The predetermined threshold value is a value that allows determining whether the voltage of batteries 111 is a dangerous voltage. Examples of the predetermined threshold value that can be offered are the over-charge protection voltage threshold value and the over-discharge protection voltage threshold value, but the predetermined threshold value is not limited to these examples. Threshold value determination IC 121 may also be configured to judge whether the voltage is a dangerous voltage according to whether the voltage is contained in a voltage range that consist of two predetermined threshold values. One example that can be offered of a voltage range made up of two predetermined threshold values is the voltage range that consist of the over-charge protection voltage threshold value and the over-discharge protection voltage threshold value, but the voltage range is not limited to this example.

Threshold value determination IC 121 supplies a signal indicating the result of the comparison (a signal indicating whether the voltage of batteries 111 is a dangerous voltage) to OR circuit 126.

Threshold value determination IC 121 only compares the magnitudes of a predetermined threshold value and the outputs of batteries 111 and does not need to detect the actual voltage values of the batteries and can therefore be made up of a simple circuit such as a comparator. As a result, the average power consumption of threshold value determination IC 121 is low.

Monitor IC 122 detects the voltage value of each of the plurality of batteries 111 and supplies a signal indicating the voltage values that were detected to microcomputer 125. Monitor IC 122 is here equipped with an ADC and detects the voltage values of batteries 111 by means of the ADC. Monitor IC 122, being equipped with an ADC, has a greater average power consumption than threshold value determination IC 121 that is made up of a simple circuit such as a comparator.

Charge/discharge switch 123 is provided on the wiring that connects battery unit 110 and the object to which the battery is to be connected. Turning ON charge/discharge switch 123 enables supply of electric power from battery unit 110 to the object to which the battery is to be connected and turning OFF charge/discharge switch 123 cuts off the supply of electric power from battery unit 110 to the object to which the battery is to be connected.

Detection resistor 124 is provided on the wiring that connects battery unit 110 and the object to which the battery is to be connected.

Based on the signal supplied from monitor IC 122, microcomputer 125 supplies a signal indicating whether the voltage of batteries 111 is a dangerous voltage. Microcomputer 125 further detects the current value of the current that flows through detection resistor 124, and based on the detection result and the signal that is supplied from monitor IC 122, implements processing such as establishing voltage balance among the plurality of batteries 111.

When a signal indicating that the voltage of batteries 111 is a dangerous voltage is supplied from at least one of threshold value determination IC 121 and microcomputer 125, OR circuit 126 supplies to charge/discharge switch 123 a signal indicating that charge/discharge switch 123 is to be turned OFF and thus turns OFF charge/discharge switch 123.

In FIG. 1, an example has been described in which each of threshold value determination IC 121 and microcomputer 125 supplies to OR circuit 126 a signal indicating whether the voltage of batteries 111 is dangerous, and when a signal indicating that the voltage of batteries 111 is a dangerous voltage is supplied, OR circuit 126 turns OFF charge/discharge switch 123. However, the present invention is not limited to this form. Each of threshold value determination IC 121 and microcomputer 125 may also supply an alarm to system controller 130 that performs processing in response to errors of battery system 100 when the voltage of batteries 111 is a dangerous voltage.

The operation of battery system 100 of the present exemplary embodiment is next described.

Battery system 100 of the present exemplary embodiment is provided with three operating modes.

The first operating mode is the sleep mode. In the sleep mode, threshold value determination IC 121 and monitor IC 122 are halted.

Battery system 100 operates in the sleep mode in states in which an object to which the battery is to be connected is not connected (storage state) or in states in which an object to which the battery is to be connected is connected but the power supply is not being applied to the object to which the battery is to be connected. Because there is no need to supply an alarm in these states, threshold value determination IC 121 and monitor IC 122 are halted. Because threshold value determination IC 121 and monitor IC 122 are halted, monitoring of the voltage values of batteries 111 is completely halted, and power consumption in battery system 100 is therefore limited to the minimum.

The second operating mode is the standby mode. In the standby mode, monitor IC 122 is halted, but threshold value determination IC 121 is in operation.

Battery system 100 operates in the standby mode in states in which an object to which the battery is to be connected is connected and the power supply is being applied to the object to which the battery is to be connected but in which commands for monitoring the state of batteries 111 have not been transmitted from system controller 130. Examples that can be offered of states in which charging/discharging operation are in the standby mode are next described. In a battery system for peak cutting and peak shifting for office use, the standby state is the state that immediately follows full charging of batteries 111 when charging has taken place during the night. In a storage battery system for residential use, the standby state is the state in which a battery system has been installed and has a complete charge but is still unused because, for example, an occupant has not yet taken up residence. Alternatively, in a back-up battery system, the standby state is the state that immediately follows completion of charging of batteries 111 after the end of a power outage. In these states, charging/discharging operations are not being carried out and system controller 130 accordingly has no need to transmit commands to carry out monitoring by monitor IC 122. In the above-described states, battery system 100 may continue in the standby state over long periods of time. In such cases, operating in the standby mode enables protection of batteries 111 while limiting power consumption.

In the standby mode, monitor IC 122 is halted and therefore is unable to detect the actual voltage value of batteries 111 or establish balance of voltage among batteries 111. However, threshold value determination IC 121 is operating and is therefore able to judge whether the voltage of batteries 111 is a dangerous voltage. Accordingly, an alarm can be supplied to system controller 130 in the event of an abnormality of batteries 111. In addition, the power consumption in battery system 100 is limited because monitor IC 122 that has high average power consumption is halted. In this way, protection of batteries 111 can be achieved at low power consumption in the standby mode.

The third operating mode is the normal operating mode. In the normal operating mode, threshold value determination IC 121 and monitor IC 122 are in operation.

Battery system 100 operates in the normal operating mode when in a state in which an object to which the battery is to be connected is connected, the power supply of the connection object is being applied, and charging/discharging is being carried out.

In the normal operating mode, threshold value determination IC 121 and monitor IC 122 are in operation. As a result, the determination of whether the voltage of batteries 111 is a dangerous voltage based on comparison with a predetermined threshold value is being carried out by threshold value determination IC 121. If the voltage of batteries 111 should be a dangerous voltage, the danger is displayed on external display console 150 by way of system controller 130 and the user is thus urged to take appropriate measures. In addition, charge/discharge switch 123 is turned OFF and the supply of electric power is halted. The judgment of whether the voltage of batteries 111 is a dangerous voltage that is based on the detection results of monitor IC 122 as well as the process of establishing balance of the voltages among the batteries are carried out by microcomputer 125. As a result, the protection of batteries 111 can be adequately achieved. In addition, even when monitor IC 122 and microcomputer 125 halt operation due to, for example, a breakdown, the judgment of whether the voltage of batteries 111 is a dangerous voltage can be still be carried out if threshold value determination IC 121 is operating, and as a result, the dangerous voltage of batteries 111 will not be neglected and improved safety can be achieved.

In addition, the operating modes of battery system 100 are switched according to input from a manager.

According to the present exemplary embodiment, battery system 100 thus includes: a plurality of batteries 111; threshold value determination IC 121 that receives the output of each of the plurality of batteries 111, compares the output with a predetermined threshold value, and supplies a signal indicating the result of comparison; and monitor IC 122 that detects the voltage value of each of the plurality of batteries 111 and supplies a signal indicating the voltage value that was detected; and is provided with a sleep mode in which threshold value determination IC 121 and monitor IC 122 are halted, a standby mode in which threshold value determination IC 121 operates and monitor IC 122 is halted, and a normal operating mode in which threshold value determination IC 121 and monitor IC 122 operate.

Threshold value determination IC 121 can be made up of a simple circuit and therefore has lower power consumption than monitor IC 122. As a result, switching the operating mode according to the state of use of battery system 100 causes threshold value determination IC 121 and monitor IC 122 to operate or halt and thereby enables not only improved safety but also improved economy due to the reduction of power consumption.

In the present exemplary embodiment, an example was described in which threshold value determination IC 121, monitor IC 122, charge/discharge switch 123, detection resistor 124, microcomputer 125, and OR circuit 126 are configured on one board, but the present invention is not limited to this configuration.

Figure 2:
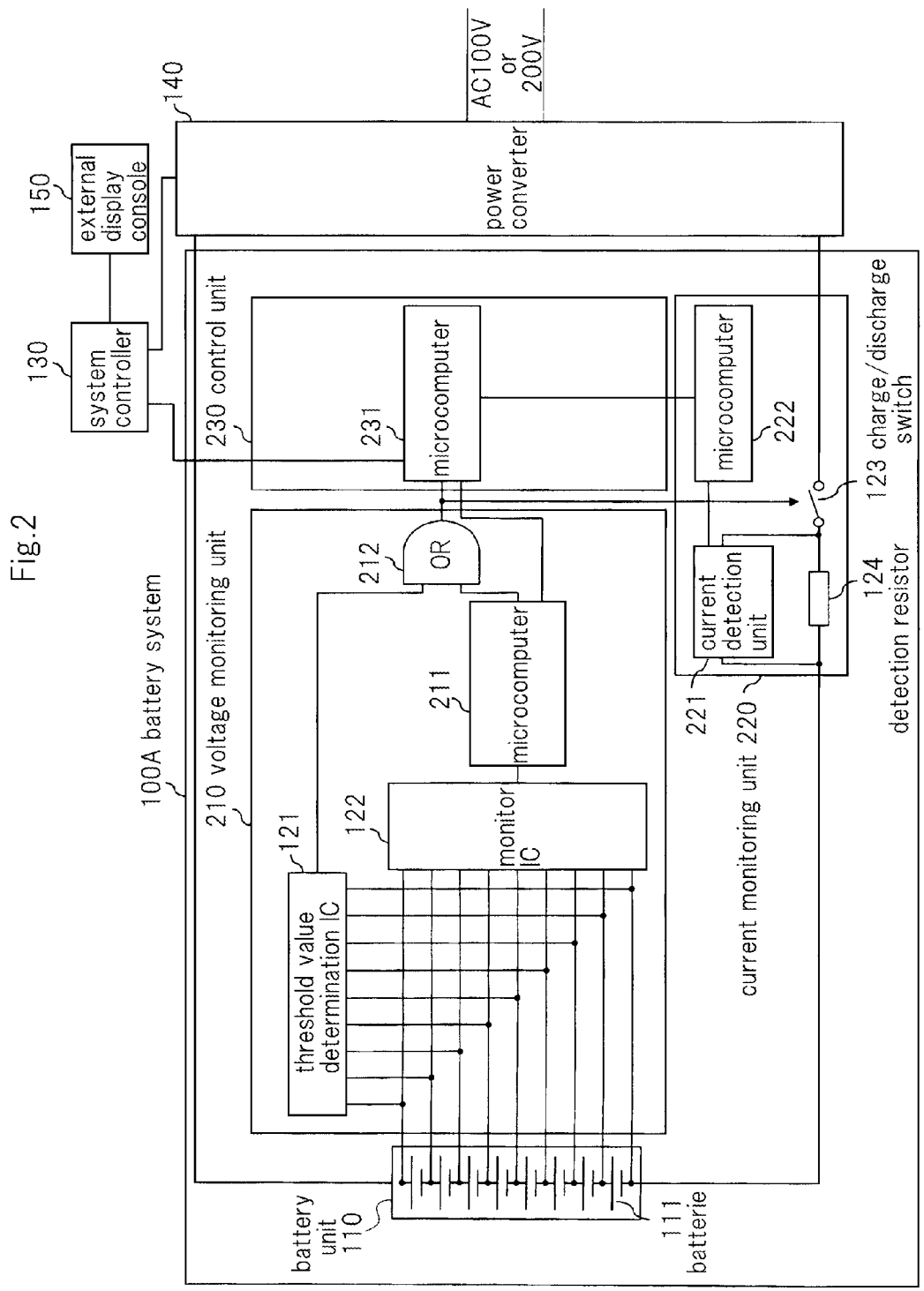
FIG. 2 is a block diagram showing another configuration of the battery system of an exemplary embodiment of the present invention.

FIG. 2 is a block diagram showing the configuration of battery system 100A that has a configuration that differs from that of battery system 100 shown in FIG. 1. In FIG. 2, constructions that are identical to FIG. 1 are given the same reference numbers and redundant explanation is omitted.

Battery system 100A shown in FIG. 2 differs from battery system 100 shown in FIG. 1 in that protection unit 120 has been deleted and voltage monitoring unit 210, current monitoring unit 220, and control unit 230 have been added.

Voltage monitoring unit 210 includes threshold value determination IC 121, monitor IC 122, microcomputer 211, and OR circuit 212. Current monitoring unit 220 includes charge/discharge switch 123, detection resistor 124, current detection unit 221, and microcomputer 222. Control unit 230 includes microcomputer 231. Voltage monitoring unit 210, current monitoring unit 220, and control unit 230 are each configured on different boards.

Voltage monitoring unit 210 monitors the voltage of each of the plurality of batteries 111.

Microcomputer 211 supplies to OR circuit 212 a signal indicating whether the voltage of batteries 111 is a dangerous voltage based on the signal supplied from monitor IC 122. In addition, microcomputer 211 supplies to microcomputer 231 a signal indicating the voltage value of each of the plurality of batteries 111 that was detected by means of monitor IC 122.

When a signal indicating that the voltage of batteries 111 is a dangerous voltage is supplied from at least one of threshold value determination IC 121 and microcomputer 211, OR circuit 212 supplies to microcomputer 231 a signal indicating that charge/discharge switch 123 is to be turned OFF.

Current monitoring unit 220 detects the current value of the current that flows through detection resistor 124 and supplies to microcomputer 231 a signal that accords with the detection result.

Current detection unit 221 detects the current value of the current that flows through detection resistor 124 and supplies to microcomputer 222 a signal that indicates the current value that was detected.

When the current value that was detected by current detection unit 221 is an abnormal value, microcomputer 222 supplies to microcomputer 231 a signal indicating that charge/discharge switch 123 is to be turned OFF.

Control unit 230 carries out processes to control the ON/OFF of charge/discharge switch 123 and to establish balance of the voltages among the plurality of batteries 111.

When a signal indicating that charge/discharge switch 123 is to be turned OFF is supplied from OR circuit 212 or microcomputer 222, microcomputer 231 turns OFF charge/discharge switch 123. In addition, microcomputer 231 carries out the process to establish voltage balance among each of batteries 111 based on the voltage values of each of the plurality of batteries that are indicated in the signal supplied from microcomputer 211.

Figure 3:
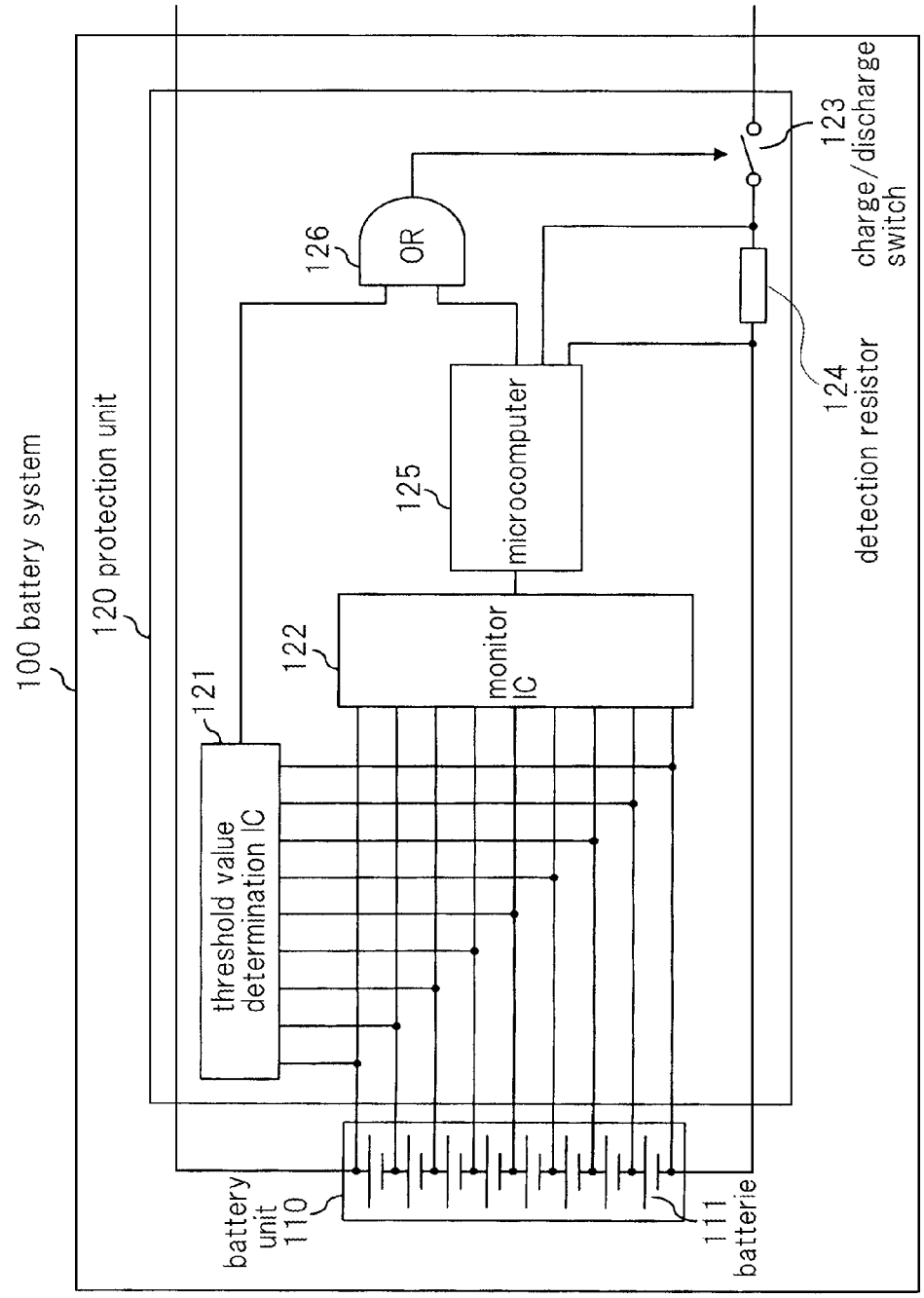
FIG. 3 is a block diagram showing an example of the configuration of the battery system of an exemplary embodiment of the present invention.
Figure 4:
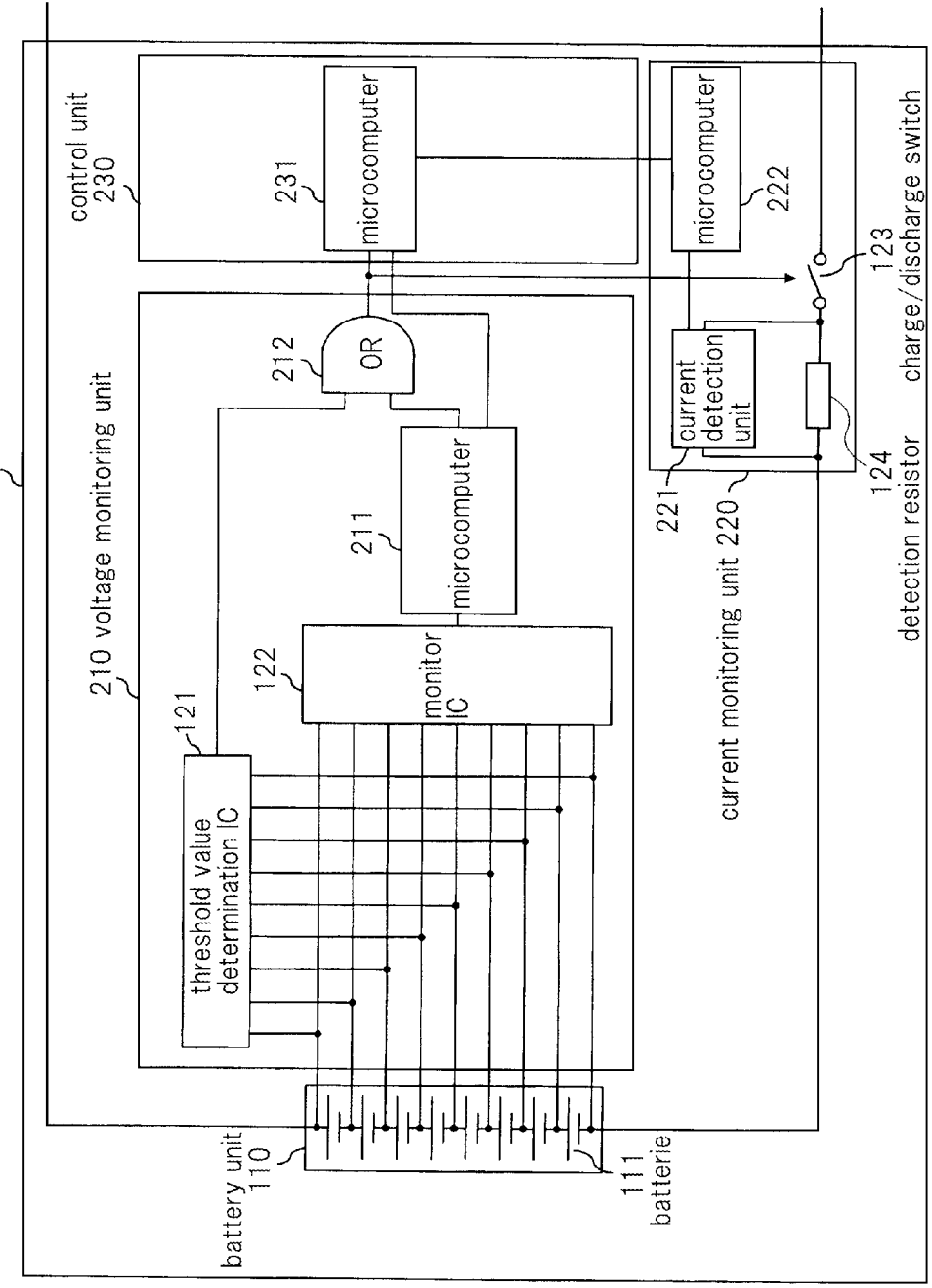
FIG. 4 is a block diagram showing an example of the configuration of the battery system of an exemplary embodiment of the present invention.

In each of the exemplary embodiments described hereinabove, the configurations shown in FIG. 1 and FIG. 2 are only examples, and the present invention is not limited to these configurations. In other words, the battery systems 100 and 100A of the present exemplary embodiments can have the configuration of FIG. 3 or FIG. 4 and can be connected to any object that is to be connected to the power supply, and can carry out charging/discharging with the connection object.

Although the invention of the present application has been described hereinabove with reference to the exemplary embodiments, the present invention is not limited to the above-described exemplary embodiments. The configuration and details of the invention of the present application are open to various modifications within the scope of the invention of the present application that will be clear to one of ordinary skill in the art.

This application claims the benefits of priority based on Japanese Patent Application No. 2013-51874 for which application was submitted on Mar. 14, 2013 and incorporates by citation all of the disclosures of that application.

What is claimed is:

1. A battery system comprising:
   a plurality of batteries;
   a first monitor unit that receives as input the outputs of said batteries, compares said outputs with a predetermined threshold value, and supplies a signal indicating the result; and
   a second monitor unit that detects the voltage values of said batteries and supplies a signal indicating the detected voltage values;
   wherein said battery system is provided with:
   a first operating mode in which said first monitor unit and said second monitor unit are halted, a second operating mode in which said first monitor unit operates and in which said second monitor unit is halted, and a third operating mode in which said first monitor unit and said second monitor unit operate.

2. The battery system as set forth in claim 1, further comprising:
   a charge/discharge switch that is provided on wiring that connects said batteries and an object that is to be connected to said battery system and that turns ON or OFF according to at least one of a signal supplied from said first monitor unit and a signal supplied from said second monitor unit.

3. The battery system as set forth in claim 1, wherein the second monitor unit has a greater average power consumption than the first monitor unit.

* * * * *